(12) United States Patent
Fulde et al.

(10) Patent No.: US 12,506,488 B2
(45) Date of Patent: Dec. 23, 2025

(54) METHOD AND SYSTEM FOR DIGITAL BACKGROUND OFFSET CORRECTION OF A COMPARATOR IN AN ANALOG-TO-DIGITAL CONVERTER

(71) Applicant: Intel Corporation, Santa Clara, CA (US)

(72) Inventors: Michael Fulde, Weil (DE); Harneet Khurana, Cupertino, CA (US); Matteo Camponeschi, Villach (AT); Patrizia Greco, Villach (AT); Christian Lindholm, Villach (AT); Martin Clara, Santa Clara, CA (US); Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 666 days.

(21) Appl. No.: 17/809,561

(22) Filed: Jun. 29, 2022

(65) Prior Publication Data
US 2024/0007117 A1    Jan. 4, 2024

(51) Int. Cl.
*H03M 1/06* (2006.01)
*H03M 1/10* (2006.01)

(52) U.S. Cl.
CPC ....... *H03M 1/0673* (2013.01); *H03M 1/1023* (2013.01); *H03M 1/1057* (2013.01)

(58) Field of Classification Search
CPC ..... H03M 1/10; H03M 1/0673; H03M 1/1061
USPC ......................................... 341/118, 120, 155
See application file for complete search history.

(56) References Cited

U.S. PATENT DOCUMENTS

2012/0126781 A1* 5/2012 Narayanan ..... G01R 31/318516
324/76.11

* cited by examiner

*Primary Examiner* — Peguy Jean Pierre
(74) *Attorney, Agent, or Firm* — 2SPL Patent Attorneys PartG mbB; Yong Beom Hwang (57) ABSTRACT

A multi-step analog-to-digital converter (ADC). The ADC includes a sampling circuitry, a comparator, a trimming circuitry, and a DC offset actuator. The sampling circuitry is configured to sample an input analog signal. The comparator is for comparing the input analog signal sample or a residual component of the input analog signal sample to a reference value in each step. The trimming circuitry is configured to receive at least one low-order bit (e.g., a least significant bit and/or a second-least significant bit) of digital binary bits of each input analog signal sample and average the low order bit over a plurality of input analog signal samples and generate a control signal for correcting an input DC offset of the comparator based on an average value of the low-order bits. The DC offset actuator is configured to correct the input DC offset of the comparator based on the control signal.

20 Claims, 10 Drawing Sheets

METHOD AND SYSTEM FOR DIGITAL BACKGROUND OFFSET CORRECTION OF A COMPARATOR IN AN ANALOG-TO-DIGITAL CONVERTER

BACKGROUND

Figure 1:
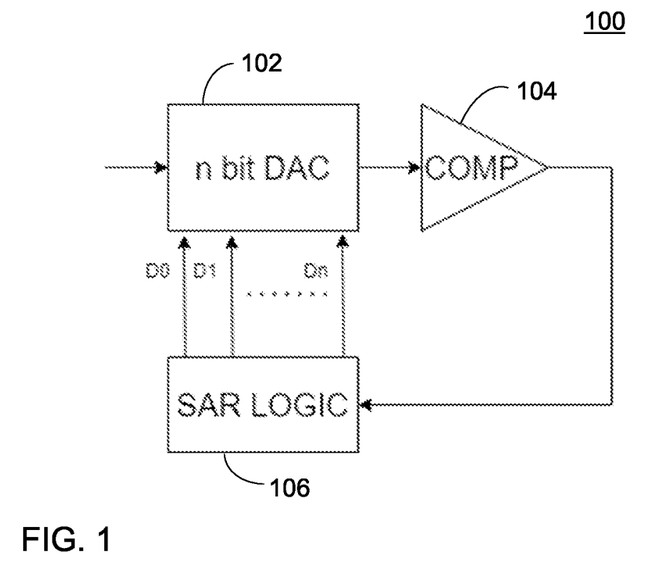
FIG. 1 is a schematic block diagram of an example SAR ADC.

A successive approximation register (SAR) analog-to-digital converter (ADC) constitutes a very power efficient class of ADC circuits. FIG. 1 is a schematic block diagram of an example SAR ADC 100. The SAR ADC 100 includes a digital-to-analog converter (DAC) 102, one or more comparators 104, and a SAR controller 106 (SAR logic). The DAC 102 is an n-bit DAC, where n is a positive integer (e.g., 1, 2, . . . ). The DAC 102 may be a capacitive DAC (e.g., a differential capacitive DAC) including an array of capacitors coupled in parallel to an output node of the DAC. The input analog signal is sampled and then compared to a threshold by the comparator 104. The threshold may be setup through the DAC 102 at a certain level(s) of the initial or remaining SAR search range. The SAR controller 106 is configured to generate a control signal for the DAC 102 for each conversion step based on an output(s) of the comparator(s) 104. The SAR controller 106 is configured to iteratively perform multiple steps of conversions for converting the analog input signal to digital data from the most significant bit (MSB) to the least significant bit (LSB).

Figure 2:
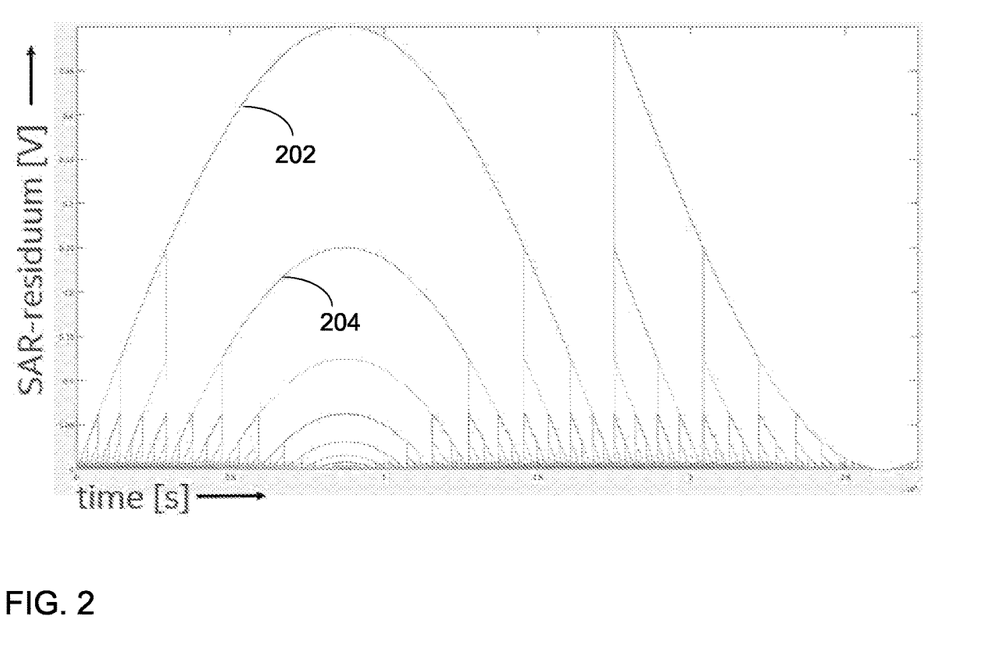
FIG. 2 shows residuals of a converted sine wave by an ideal SAR ADC.

The LSBs of a multi-step ADC that converts an input sample to digital in multiple steps (such as an SAR ADC, a multi-step flash ADC, a pipelined ADC, or the like) have very little input signal content (often even noise dominated). After each conversion step, the residual voltage of the sample becomes more and more noise-like. FIG. 2 shows residuals of a converted sine wave by an ideal SAR ADC. Each graphs represents the residual per bit converted. The residual signal is converted to digital in each step of the SAR ADC, and as the processing comes to an end of the conversion, the digital bit is more or less noise.

Figure 3:
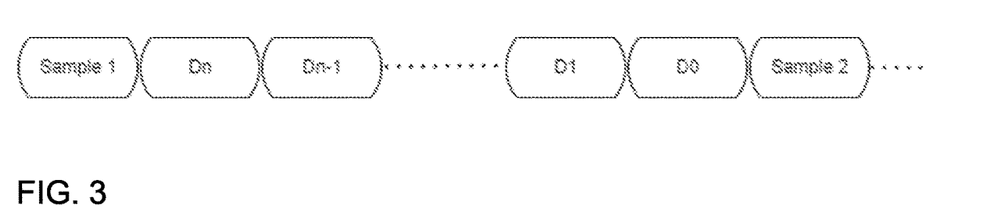
FIG. 3 shows the sampling and analog-to-digital conversion processing by a SAR ADC.

FIG. 3 shows the sampling and analog-to-digital conversion processing by a SAR ADC, where Dn is an MSB, D1 is a second-least significant bit, and D0 is an LSB. After conversion of Dn, the residual signal would be the graph 202 in FIG. 2, after conversion of Dn-1, the residual would be the graph 204 in FIG. 2, and so on, and the residual signals for D1 and D0 are the signals with very small amplitude.

A comparator (e.g., an operational amplifier) is a device that compares the input voltages at the two input terminals and generates a binary output bit. An input DC offset voltage of a comparator is an input voltage at which its output changes from one logic level to the other. The cause of the input DC offset voltage may be due to the mismatch of the input transistors and components during fabrication of the silicon die or stresses placed on the die during the packaging process (minor contribution). These effects collectively produce a mismatch of the bias currents that flow through the input circuit, resulting in a voltage differential at the input terminals of the comparator, which requires to balance the comparator gain stages at its trip point. This is the definition of the comparator DC-offset.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

The comparator DC offset needs to be corrected. An extra time window for a comparator decision may be needed to perform a comparator DC offset correction (either analog auto-zero or digital trimming) in background without redundancy (e.g., extra comparators or full ADC that are taken out of commission for calibration). Background calibration may be done after the conversion or during input signal sampling. Foreground offset trim/calibration of the comparator(s) may also be performed. However, with the foreground offset trim/calibration, the ADC performance may suffer over time due to drift (e.g., temperature change). Alternatively, auto-zero may be performed inside the conversion window (e.g., before or after the conversion). For example, an auto-zero decision may be made by shorting the comparator inputs at the end of the SAR conversion cycle and using this "auto-zero" decision to operate a feedback loop (DC offset correction loop) that forces the respective comparator DC offset to zero. However, the auto-zero reduces the maximum SAR conversion rate because the overall time allocated for the conversion and auto-zero is increased. The reduction in conversion rate can be compensated by increasing the time interleaving (TI)-factor but it needs power, area, etc. The auto-zero may be performed during sampling. However, it needs an extra SAR logic. In addition, the ADC performance may suffer over time due to drift (e.g., temperature change). Alternatively, redundant elements (e.g., extra comparator, extra ADC, etc.) may be used to swap and calibrate, but it increases complexity, area, and power.

Examples are disclosed for digital background DC offset correction of a comparator in a multi-step ADC that converts the input analog signal sample to digital in multiple steps. The multi-step ADC may be a SAR ADC, a pipelined ADC, a multi-step flash ADC, or the like. In examples, one or more of the last "noisy" conversion results (e.g., one or more lower order bits) may be used to measure and calibrate the DC offset of a comparator in an ADC in background during the actual data conversion. This digital calibration may be done in background based on the data that has already been produced by the ADC. There is no extra logic needed in the ADC to measure the DC offset, and therefore there is no speed penalty. Since the digital calibration is performed in the background, it can be run at a slower speed than the ADC itself, which saves power.

In examples, one or more of the lower-order bits (e.g., the least-significant bit, the second-least significant bit, . . . ) are digitally post-processed to calculate the DC offset in the comparator and then used to compensate for the comparator DC offset. In an ideal case since the bit content of the low-order bits (e.g., the LSB, a second-least significant bit) is more or less noise, the average of the low-order bits would be 0.5 (i.e., equal number of ones and zeros). If the average is above or below 0.5, it is very likely that a DC offset exists in the ADC comparator. Therefore, a control signal for correcting/compensating the input DC offset of the comparator may be generated based on the average value of the low-order bits.

Figure 4:
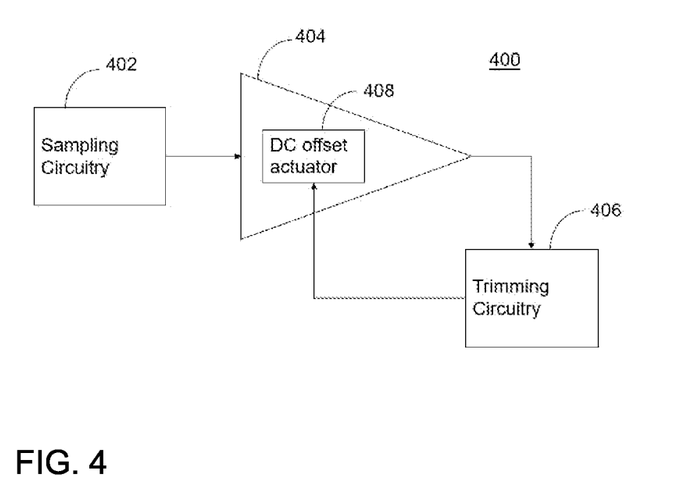
FIG. 4 is a schematic block diagram of an example multi-step ADC for converting an input analog signal sample to digital binary bits in multiple steps in accordance with one example.

FIG. 4 is a schematic block diagram of an example multi-step ADC for converting an input analog signal sample to digital binary bits in multiple steps in accordance with one example. In examples, the ADC 400 may include a sampling circuitry 402, a comparator(s) 404, a trimming circuitry 406, and a DC offset actuator 408. The sampling circuitry 402 is configured to sample an input analog signal. The sampling circuitry 402 may be a sample-and-hold circuitry, or a (differential) capacitive DAC, or the like. The comparator 404 is for comparing the input analog signal sample or a residual component of the input analog signal sample after each conversion step to a reference value in each step. The digital binary bits of the input analog signal sample are determined based on the outputs of the comparator 404. The trimming circuitry 406 is configured to receive at least one low-order bit of digital binary bits or the output of the comparator 404 of each input analog signal sample and average the at least one low order bit or the output of the comparator 404 over a plurality of input analog signal samples and generate a control signal for correcting an input DC offset of the comparator 404 based on an average value of the low-order bits or the outputs of the comparator 404. The DC offset actuator 408 is configured to adjust the input DC offset of the comparator 404 based on the control signal. The DC offset actuator 408 may be inside the comparator 404 as shown in FIG. 4, or alternatively in the trimming circuitry 406. For example, the offset actuator 408 may include small programmable capacitors, resistors, or current sources appropriately connected to (differential) internal nodes in the comparator 404 to minimize the DC offset.

The control signal may be generated based on, for example, an LSB and/or a second-least significant bit of the digital output bits (or the comparator outputs) of the plurality of samples of the input analog signal. The bit position of the at least one low-order bit may be fixed for each input analog signal sample. Alternatively, the bit position of the at least one low-order bit may alternate over consecutive input analog signal samples or after every pre-determined number of analog signal samples. Alternatively, the ADC may include a selection circuitry configured to randomly select a bit position of the at least one low-order bit for each input analog signal sample based on an output of a pseudo-random number generator. The trimming circuitry 406 may include an up/down counter for averaging the low-order bits of the digital output bits (or the comparator outputs) of the plurality of input analog signal samples. Alternatively, a digital filter may be used for averaging the low-order bits of the digital output bits (or the comparator outputs). The example schemes may remove not only DC offsets but also I/f noise (if the digital filter is built for it).

In some examples, the ADC 400 may include multiple comparators for either a multi-bit per cycle conversion or a single-bit per cycle conversion. In this case, each comparator may comprise a trimming circuitry and an offset actuator for correction of the input DC offset of each comparator. In some examples, an input DC offset of one comparator may be corrected independently and an input DC offset of other comparators may be corrected based on an output of the one comparator (track the output of the independently calibrated comparator). The ADC 400 may be one of a successive approximation register ADC, a multi-step flash ADC, or a pipelined ADC.

Figure 5:
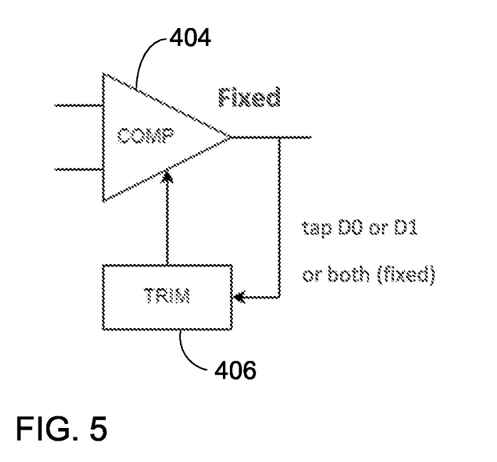
FIGS. 5-7 show examples for generating a control signal for correcting the input DC offset of the comparator based on one or more low-order output bits of the ADC.

FIG. 5 shows an example for generating a control signal for correcting the input DC offset of the comparator based on one or more low-order bits of the ADC. In this example, the LSB (D0) or the second-least-significant bit (D1) or both of the binary output bits of the ADC of each input analog signal sample is tapped to the trimming circuitry 406. The trimming circuitry 406 may average the LSBs (D0) and/or the second-least-significant bits (D1) over multiple input analog signal samples. The trimming circuitry 406 may then generate a control signal for correcting/compensating the input DC offset of the comparator 404 based on the average value. In this example, the bit position of the low-order binary bit(s) to be tapped to the trimming circuitry 406 may be fixed, which is programmable. For example, D0, D1, or both may be tapped from the digital binary bits of each input analog signal sample and averaged over multiple input analog signal samples.

Figure 6:
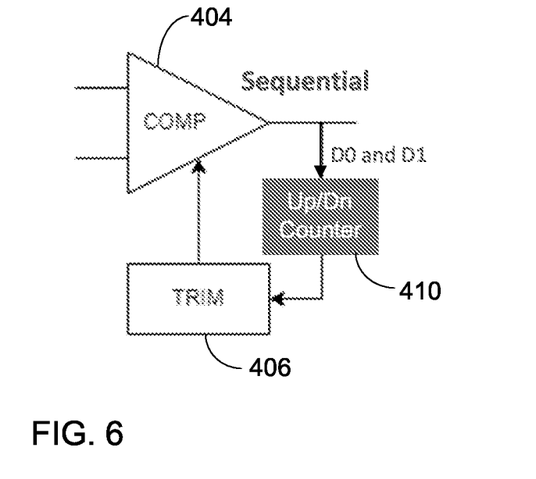

FIG. 6 shows another example for generating a control signal for correcting the input DC offset of the comparator based on one or more low-order bits of the ADC. In this example, the bit position of the low-order bit to be tapped to the trimming circuitry 406 may be sequential over multiple input analog signal samples. For example, the LSB (D0) and the second-least-significant bit (D1) of the binary output bits of each input analog signal sample may be taken alternatingly over two consecutive samples or after every predetermined number of analog signal samples (e.g., D0 from one sample, D1 from the next sample, D0 from the following sample, and so on). The tapped low-order bits are averaged over multiple input analog signal samples, for example using an up/down counter 410. The trimming circuitry 406 may then generate a control signal for correcting/compensating the input DC offset of the comparator 404 based on the average value.

Figure 7:
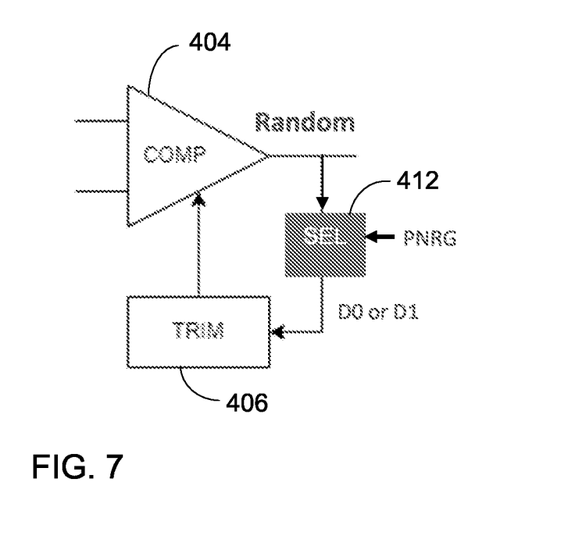

FIG. 7 shows another example for generating a control signal for correcting the input DC offset of the comparator based on one or more low-order bits of the ADC. In this example, the bit position of the low-order bit(s) of the binary output bits of each analog signal sample may be selected randomly for each input analog signal sample based on an output of a pseudo-random number (bit stream) generator. For example, the LSB (D0) and/or the second-least-significant bit (D1) of the binary output bits of the ADC may be randomly selected by a selection circuitry 412 for each input analog signal sample based on an output of a random number (bit stream) generator and averaged over multiple input analog signal samples. In this example, the selected bit position is randomly swapped over samples. The trimming circuitry 406 may then generate a control signal for correcting/compensating the input DC offset of the comparator based on the average value. In examples, the pseudo-random number (bit stream) generator may be updated every N-th analog signal sample, N being an integer greater than one. The random selection of the low-order bit position may be performed every N-th sample.

The up/down counter 410 shown in FIG. 6 may be used in other examples of FIGS. and 7 as well. Alternatively, a digital filter may be used for averaging the low-order bits over a plurality of samples.

Figure 8:
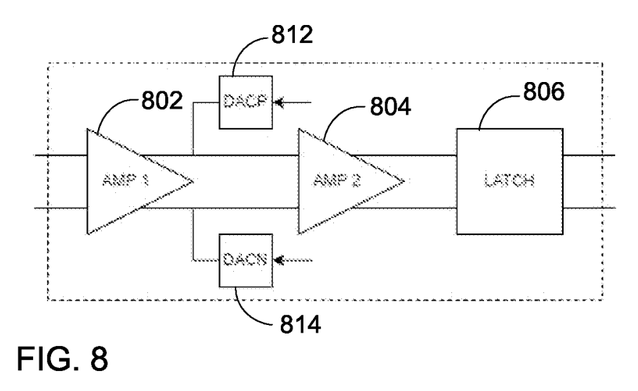
FIG. 8 shows a comparator with an example trimming circuitry.

FIG. 8 shows a comparator 800 with an example trimming circuitry. In this example, the comparator 800 in a differential structure includes two amplifying stages 802, 804 and a latch 806. Two trimming DACs 812, 814 as a trimming circuitry are connected to the differential outputs of the first amplification stage 802, respectively. Alternatively, the trimming DACs 812, 814 may be coupled to after any amplification stage depending on the design needs.

Figure 9A:
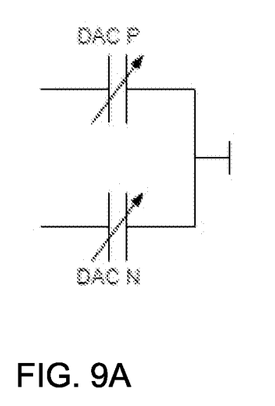
FIGS. 9A-9C show some example ways to build the trimming DAC.
Figure 9B:
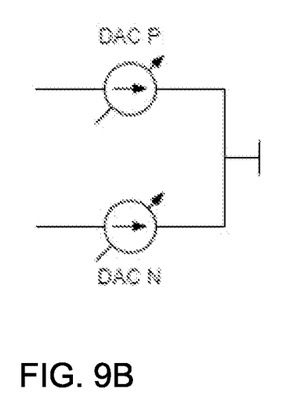
Figure 9C:
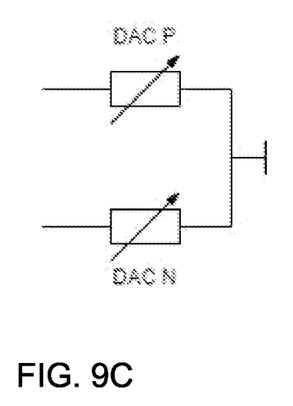

FIGS. 9A-9C show some example ways to build the trimming DAC 812, 814. The trimming DAC 812, 814 may be built with programmable capacitors (FIG. 9A), programmable current sources (FIG. 9B), or programmable resistors (FIG. 9C).

The input DC offset compensation scheme may be used not only for a single-bit per cycle ADC but also for a multi-bit per cycle ADC. A multi-bit per cycle ADC (e.g., a 2-bit per cycle SAR ADC) uses multiple comparators (e.g., three comparators in parallel in case of 2-bit per cycle conversion) simultaneously for multiple bits of conversion per cycle. Alternatively, multiple comparators may be used in parallel for a single-bit conversion as well to reduce noise, or the like (e.g., use three comparators for a single bit conversion by majority voting). In these cases, each of the comparators may have their own calibration loop including a trimming circuitry for DC offset correction.

In case of 2-bit per cycle conversion, the outputs of the three comparators are thermometer coded and converted to binary bits by a thermometer-to-binary encoder. Each comparator outputs may be averaged over multiple analog signal samples, respectively, and compared to a corresponding threshold. The thresholds for the upper, middle, and lower comparators are set differently (e.g., 0.25, 0.5, and 0.75 for the upper, middle, and lower comparators, respectively).

In case where multiple comparators are used in parallel for a single-bit conversion, one of the comparators (e.g., the middle comparator in case of two bit per cycle conversion) may be calibrated towards zero-volt offset using the example schemes disclosed above and other comparators (the upper and lower comparators in case of two bit per cycle conversion) may track the output of the calibrated comparator (e.g., the middle comparator).

Figure 10:
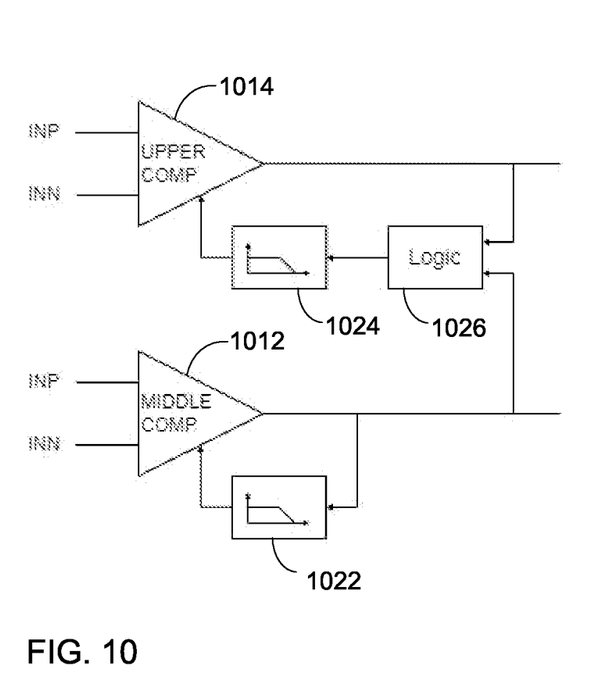
FIG. 10 shows the case where one or both of the outer comparators follows the output of the middle comparator.

FIG. 10 shows the case where one or both of the outer comparators follows the output of the middle comparator. FIG. 10 shows the middle comparator 1012 and the upper comparator 1014 for 2-bit/cycle converter along with calibration loops including the trimming circuitry 1022, 1024. The lower comparator is not shown in FIG. 10 for simplicity, but the lower comparator may have the same structure as the upper comparator 1014. The offset actuator (e.g., a trim DAC(s)) may be included in the comparators. Both the upper comparator 1014 and the middle comparator 1012 receive the same input. The calibration loop for the middle comparator 1012 processes an output the middle comparator 1012 only. However, the calibration loop for the upper comparator 1014 processes outputs of both the upper and middle comparators 1012, 1014.

The output of the middle comparator 1012 is tapped to the trimming circuitry 1022 to calibrate the DC offset of the middle comparator 1012 as disclosed above. The upper comparator 1014 also has the calibration loop including the trimming circuitry 1024. The calibration loop of the upper comparator 1014 includes a tracking circuitry 1026 for tracking the output of the middle comparator 1012. The tracking circuitry 1026 receives the outputs of the middle comparator 1012 and the upper comparator 1014 and subtract one from the other and the difference may be filtered by the trimming circuitry 1024 for calibrating the offset in the upper comparator 1014. For example, if the outputs of the middle comparator 1012 and the upper comparator 1014 [middle comp, upper comp] are [0, 0] or [1, 1], the loop filter for the upper comparator 1014 is not updated since the two outputs are the same. For outputs [0, 1], the loop filter value for the upper comparator 1014 is decreased since the upper comparator 1014 shows a higher value than the middle comparator 1012. For outputs [1, 0], the loop filter value for the upper comparator 1014 is increased since the upper comparator 1014 shows a lower value than the middle comparator 1012.

In cases where there is still signal content on the bit selected to average, an extra noise (i.e., dither) may be added.

The examples disclosed herein are not limited to an SAR ADC but may also be used in other types of ADCs where all bits are not converted at once, such as a pipelined ADC, a multi-step flash ADC (e.g., a 2-step flash ADC), or the like.

Figure 11:
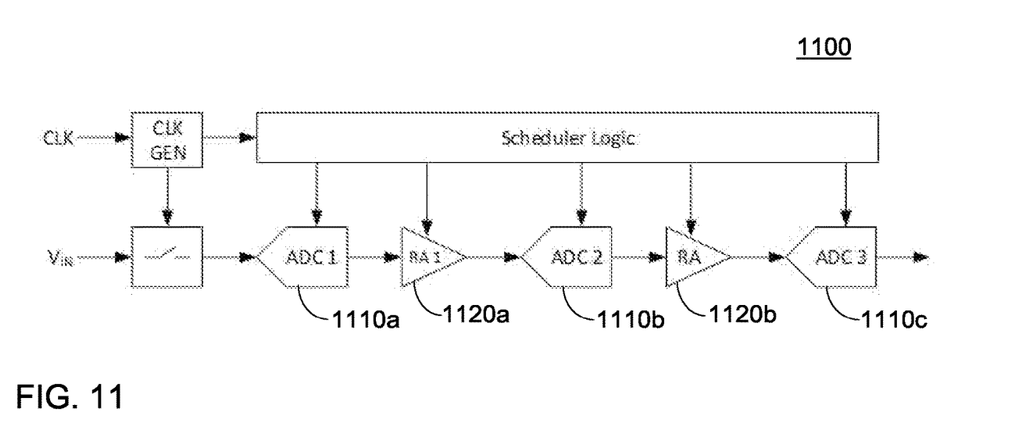
FIG. 11 is a schematic diagram of an example pipelined ADC.

FIG. 11 is a schematic diagram of an example pipelined ADC. The pipelined ADC 1100 is configured to convert an analog signal (Vin) to digital bits in multiple stages that are pipelined. A pipeline is a set of processing components connected in series where an output of one component is fed to an input of the next component and the processing by the components are performed simultaneously in a time sliced fashion. Pipelined processing refers to overlapping operations with all stages of the pipeline performing simultaneously. The number of stages may be two, three, four, or any number. The ADC 1100 includes a plurality of sub-ADCs (three sub-ADCs 1110a, 1110b, 1110c in this example) that are cascaded in a pipeline. Multiple low-resolution sub-ADCs may be cascaded to obtain a high-resolution output. Each sub-ADC 1110a, 1110b, 1110c performs an analog-to-digital conversion on an input signal to each sub-ADC 1110a, 1110b, 1110c. Each sub-ADC 1110a, 1110b, except the last sub-ADC 1110c, generates a residue signal, which is amplified by a residue amplifier (RA) 1120a, 1120b and fed to a succeeding sub-ADC and converted to digital bits by the succeeding sub-ADC. The sub-ADCs 1110a, 1110b, 1110c may be an SAR ADC, a flash-based ADC, or any other type of ADC. The input DC offset correction scheme disclosed above may be applied to the one or more last sub-ADCs in the chain to compensate the DC offset in the comparator(s) in those sub-ADCs.

Figure 12:
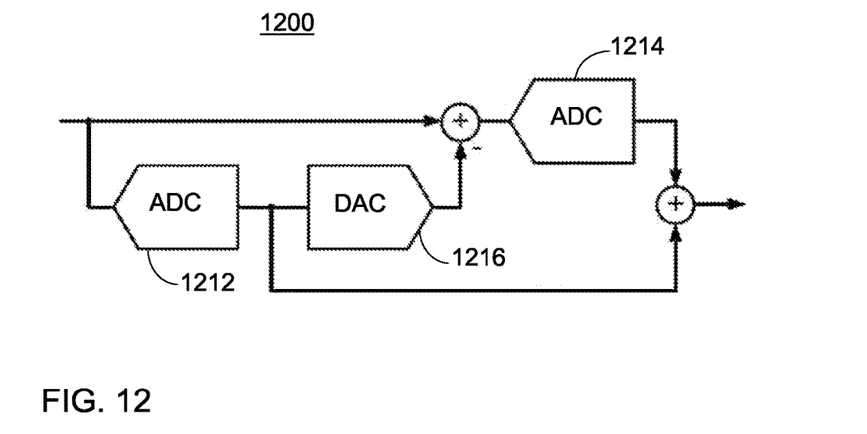
FIG. 12 is a schematic diagram of an example multi-step flash ADC.

FIG. 12 is a schematic diagram of an example multi-step flash ADC (a two-step flash ADC in this example). A multi-step flash ADC 1200 may include two or more stages. In the two-step flash ADC, the conversion is performed in two steps using two sub-ADCs (a first sub-ADC 1212 and a second sub-ADC 1214). The input analog signal sample is first processed by the first sub-ADC 1212 to generate MSB bits and then the output of the first sub-ADC 1212 is converted to an analog signal by a DAC 1216 and subtracted from the input sample and the LSB conversion is performed by the second sub-ADC 1214. The input DC offset correction scheme disclosed above may be applied to the one or more latter stage(s) sub-ADCs (the sub-ADC 1114 in this example) in the chain to compensate the DC offset in the comparator(s) in those sub-ADCs.

Figure 13:
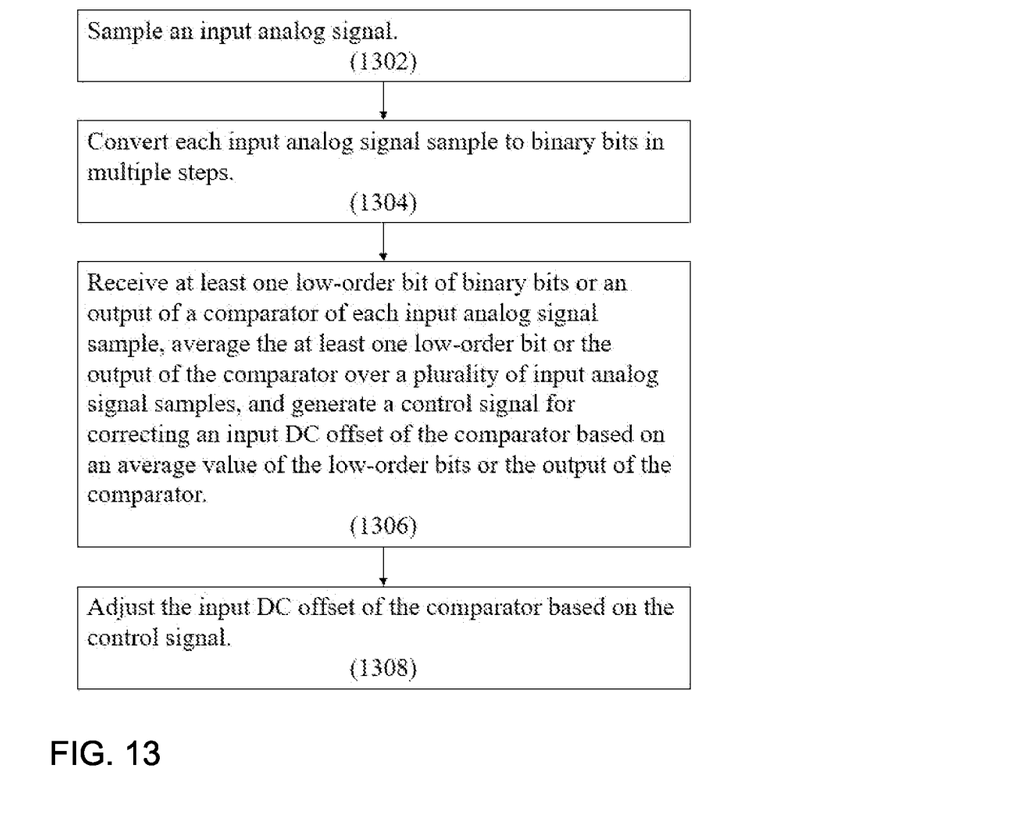
FIG. 13 is a flow diagram of an example method for controlling a DC offset of a comparator of an ADC.

FIG. 13 is a flow diagram of an example method for controlling a DC offset of a comparator of an ADC. An input analog signal is sampled (1202). Each input analog signal sample is then converted to binary bits in multiple steps (1204). The ADC includes a comparator for comparing the input analog signal sample or a residual component of the input analog signal sample to a reference value in each step. At least one low-order bit of binary bits of each input analog signal sample or an output of the comparator is tapped to a trimming circuitry and the at least one low-order bit or the output of the comparator is averaged over a plurality of input analog signal samples and a control signal for correcting an input DC offset of the comparator is generated based on an average value of the low-order bits or the outputs of the comparator (1206). The input DC offset of the comparator is then adjusted based on the control signal (1208).

The control signal may be generated based on an LSB and/or a second-least significant bit of the digital output bits of the plurality of samples of the input analog signal. A bit position of the at least one low-order bit may be fixed for each input analog signal sample. Alternatively, a bit position of the at least one low-order bit may alternate over consecutive input analog signal samples or after every pre-determined number of analog signal samples. Alternatively, a bit position of the at least one low-order bit may be randomly selected for each input analog signal sample.

In some examples, the ADC may include multiple comparators for either a multi-bit per cycle conversion or a single-bit per cycle conversion. The input DC offset of each comparator may be corrected based on outputs of each comparator. Each comparator may have a calibration loop. An input DC offset of one comparator may be calibrated independently and an input DC offset of other comparators may be corrected based on an output of the calibrated comparator. The input DC offset may be adjusted using a DC offset actuator. The DC offset actuator may include a programmable capacitor, a programmable current source or a programmable resistor. The ADC may be one of a successive approximation register ADC, a multi-step flash ADC, or a pipelined ADC.

Figure 14:
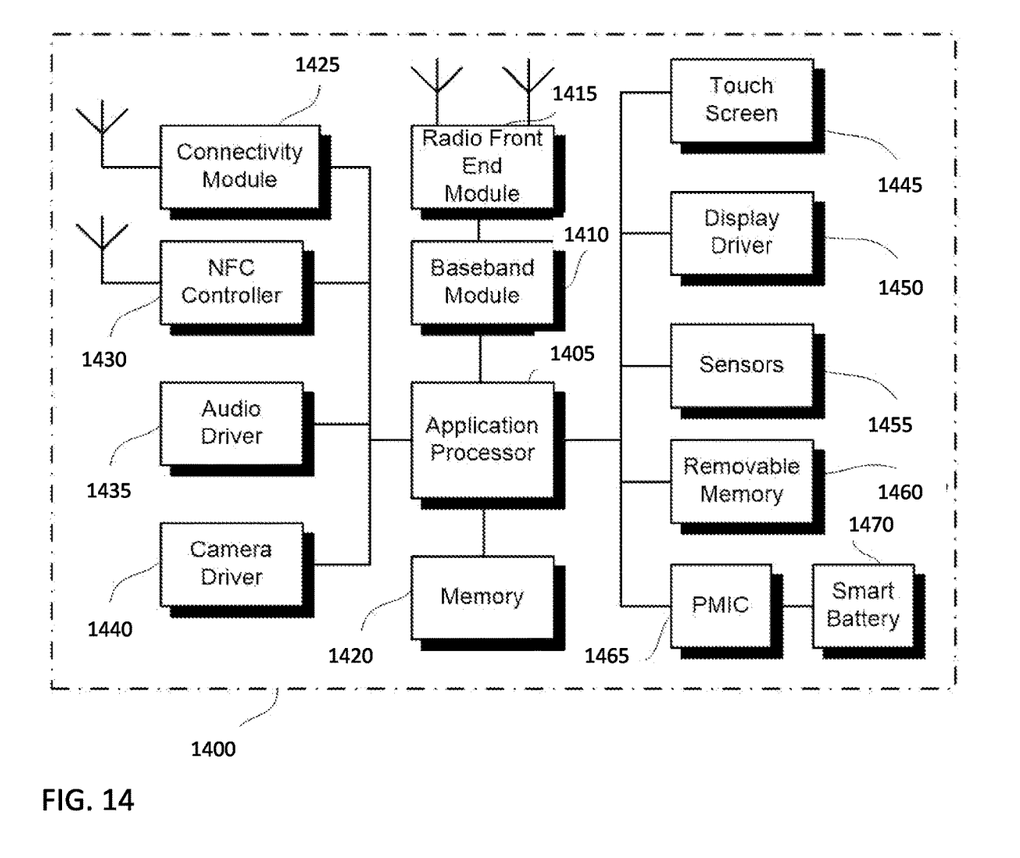
FIG. 14 illustrates a user device in which the examples disclosed herein may be implemented.

FIG. 14 illustrates a user device 1400 in which the examples disclosed herein may be implemented. For example, the examples disclosed herein may be implemented in the radio front-end module 1415, in the baseband module 1410, etc. The user device 1400 may be a mobile device in some aspects and includes an application processor 1405, baseband processor 1410 (also referred to as a baseband module), radio front end module (RFEM) 1415, memory 1420, connectivity module 1425, near field communication (NFC) controller 1430, audio driver 1435, camera driver 1440, touch screen 1445, display driver 1450, sensors 1455, removable memory 1460, power management integrated circuit (PMIC) 1465 and smart battery 1470.

In some aspects, application processor 1405 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1410 may be implemented, for example, as a solder-down substrate including one or more integrated circuits, a single packaged integrated circuit soldered to a main circuit board, and/or a multi-chip module containing two or more integrated circuits.

Figure 15:
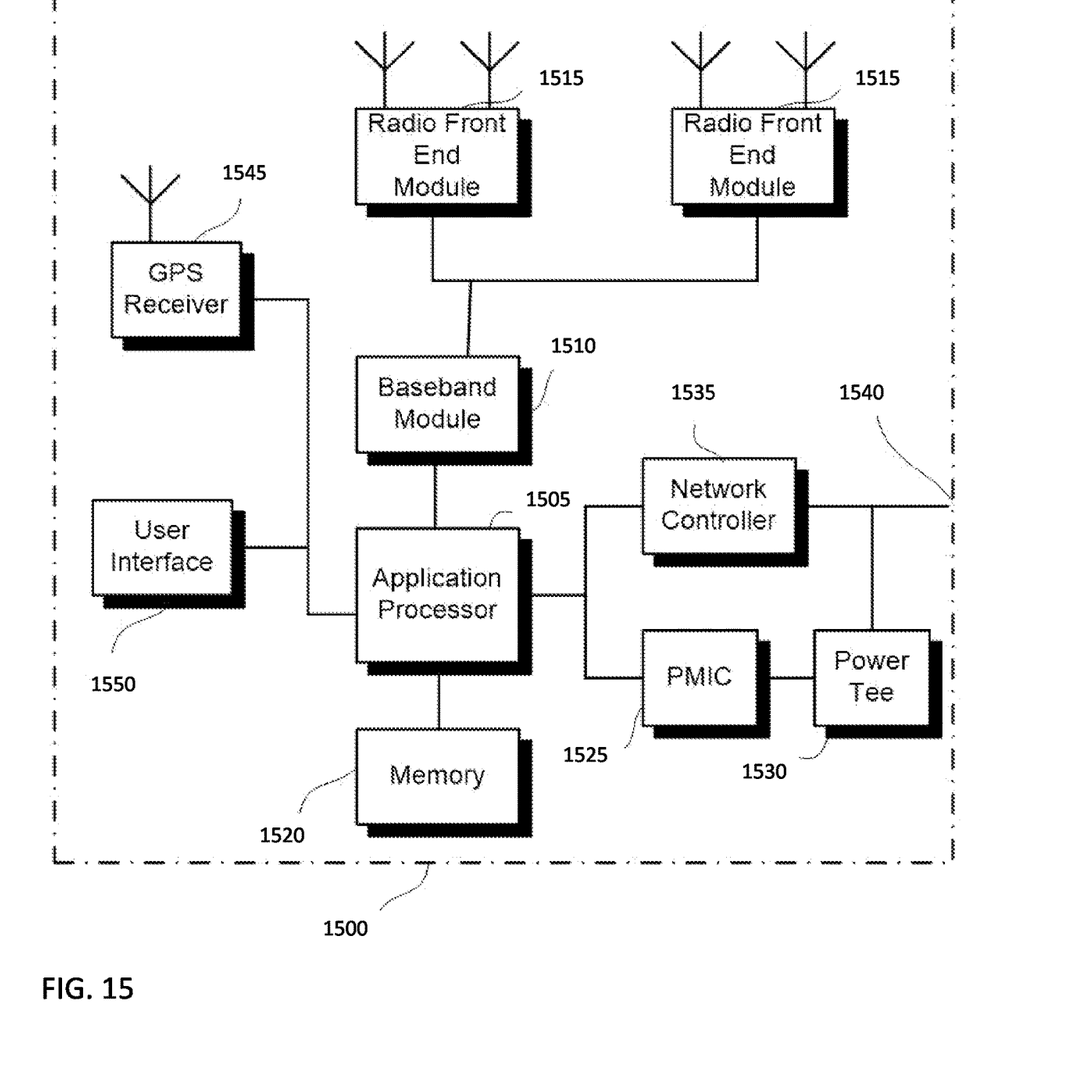
FIG. 15 illustrates a base station or infrastructure equipment radio head in which the examples disclosed herein may be implemented.

FIG. 15 illustrates a base station or infrastructure equipment radio head 1500 in which the examples disclosed herein may be implemented. For example, the examples disclosed herein may be implemented in the radio front-end module 1515, in the baseband module 1510, etc. The base station radio head 1500 may include one or more of application processor 1505, baseband modules 1510, one or more radio front end modules 1515, memory 1520, power management circuitry 1525, power tee circuitry 1530, network controller 1535, network interface connector 1540, satellite navigation receiver module 1545, and user interface 1550.

In some aspects, application processor 1505 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1510 may be implemented, for example, as a solder-down substrate including one or more integrated circuits, a single packaged integrated circuit soldered to a main circuit board or a multi-chip module containing two or more integrated circuits.

In some aspects, memory 1520 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1520 may be implemented as one or more of solder down packaged integrated circuits, socketed memory modules and plug-in memory cards.

In some aspects, power management integrated circuitry 1525 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1530 may provide for electrical power drawn from a network cable to provide both power supply and data connectivity to the base station radio head 1500 using a single cable.

In some aspects, network controller 1535 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1545 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1545 may provide data to application processor 1505 which may include one or more of position data or time data. Application processor 1505 may use time data to synchronize operations with other radio base stations.

In some aspects, user interface 1550 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a multi-step ADC for converting an input analog signal sample to binary bits in multiple steps. The ADC includes a sampling circuitry configured to sample an input analog signal, a comparator for comparing the input analog signal sample or a residual component of the input analog signal sample to a reference value in each step, a trimming circuitry configured to receive at least one low-order bit of digital binary bits of each input analog signal sample or an output of the comparator and average the at least one low order bit or the outputs of the comparator over a plurality of input analog signal samples and generate a control signal for correcting an input DC offset of the comparator based on an average value of the low-order bits or the outputs of the comparator, and a DC offset actuator configured to correct the input DC offset of the comparator based on the control signal.

Another example (e.g., example 2) relates to a previously described example (e.g., example 1), wherein the control signal is generated based on an LSB and/or a second-least significant bit of the digital output bits of the plurality of samples of the input analog signal.

Another example (e.g., example 3) relates to a previously described example (e.g., any one of examples 1-2), wherein a bit position of the at least one low-order bit is fixed for each input analog signal sample.

Another example (e.g., example 4) relates to a previously described example (e.g., any one of examples 1-3), wherein a bit position of the at least one low-order bit alternates over consecutive input analog signal samples or after every pre-determined number of analog signal samples.

Another example (e.g., example 5) relates to a previously described example (e.g., any one of examples 1-4), further comprising a selection circuitry configured to randomly select a bit position of the at least one low-order bit for each input analog signal sample based on an output of a pseudo-random generator.

Another example (e.g., example 6) relates to a previously described example (e.g., any one of examples 1-5), wherein the trimming circuitry includes an up/down counter or a digital filter for averaging the low-order bits of the digital output bits of the plurality of input analog signal samples.

Another example (e.g., example 7) relates to a previously described example (e.g., any one of examples 1-6), wherein the ADC include multiple comparators for either a multi-bit per cycle conversion or a single-bit per cycle conversion, and each comparator includes the trimming circuitry and the offset actuator for correction of the input DC offset of each comparator.

Another example (e.g., example 8) relates to a previously described example (e.g., example 7), wherein an input DC offset of one comparator is corrected independently based on its own output, and an input DC offset of each of other comparators is corrected based on a combination of an output of each comparator and the output of the independently-corrected comparator.

Another example (e.g., example 9) relates to a previously described example (e.g., any one of examples 1-8), wherein the DC offset actuator comprises a programmable capacitor, a programmable current source or a programmable resistor.

Another example (e.g., example 10) relates to a previously described example (e.g., any one of examples 1-9), wherein the ADC is one of a successive approximation register ADC, a multi-step flash ADC, or a pipelined ADC.

Another example (e.g., example 11) relates to a method for controlling a DC offset of a comparator of an ADC, comprising sampling an input analog signal, converting each input analog signal sample to binary bits in multiple steps, wherein the ADC includes a comparator for comparing the input analog signal sample or a residual component of the input analog signal sample to a reference value in each step, receiving at least one low-order bit of binary bits of each input analog signal sample or an output of the comparator and averaging the at least one low-order bit or the output of the comparator over a plurality of input analog signal samples and generating a control signal for correcting an input DC offset of the comparator based on an average value of the low-order bits or the output of the comparator, and adjusting the input DC offset of the comparator based on the control signal.

Another example (e.g., example 12) relates to a previously described example (e.g., example 11), wherein the control signal is generated based on an LSB and/or a second-least significant bit of the digital output bits of the plurality of samples of the input analog signal.

Another example (e.g., example 13) relates to a previously described example (e.g., any one of examples 11-12), wherein a bit position of the at least one low-order bit is fixed for each input analog signal sample.

Another example (e.g., example 14) relates to a previously described example (e.g., any one of examples 11-13), wherein a bit position of the at least one low-order bit alternates over consecutive input analog signal samples or after every pre-determined number of analog signal samples.

Another example (e.g., example 15) relates to a previously described example (e.g., any one of examples 11-14), wherein a bit position of the at least one low-order bit is randomly selected for each input analog signal sample based on an output of a pseudo-random generator.

Another example (e.g., example 16) relates to a previously described example (e.g., any one of examples 11-15), wherein the ADC include multiple comparators for either a multi-bit per cycle conversion or a single-bit per cycle conversion, and the input DC offset of each comparator is corrected based on outputs of each comparator.

Another example (e.g., example 17) relates to a previously described example (e.g., example 16), wherein an input DC offset of one comparator is corrected independently based on its own output, and an input DC offset of each of other comparators is corrected based on a combination of an output of each comparator and the output of the independently-corrected comparator.

Another example (e.g., example 18) relates to a previously described example (e.g., any one of examples 11-17), wherein the input DC offset is adjusted using a DC offset actuator, wherein the DC offset actuator comprises a programmable capacitor, a programmable current source or a programmable resistor.

Another example (e.g., example 19) relates to a previously described example (e.g., any one of examples 11-18), wherein the ADC is one of a successive approximation register ADC, a multi-step flash ADC, or a pipelined ADC.

Another example (e.g., example 20) relates to a machine-readable storage including machine readable instructions, when executed, to implement a method as in any one of examples 11-19.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively.

Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A multi-step analog-to-digital converter (ADC) for converting an input analog signal sample to binary bits in multiple steps, comprising:
    a sampling circuitry configured to sample an input analog signal;
    a comparator for comparing the input analog signal sample or a residual component of the input analog signal sample to a reference value in each step;
    a trimming circuitry configured to receive at least one low-order bit of digital binary bits of each input analog signal sample or an output of the comparator and average the at least one low order bit or the outputs of the comparator over a plurality of input analog signal samples and generate a control signal for correcting an input DC offset of the comparator based on an average value of the low-order bits or the outputs of the comparator; and
    a DC offset actuator configured to correct the input DC offset of the comparator based on the control signal.

2. The ADC of claim 1, wherein the control signal is generated based on a least significant bit (LSB) and/or a second-least significant bit of the digital output bits of the plurality of samples of the input analog signal.

3. The ADC of claim 1, wherein a bit position of the at least one low-order bit is fixed for each input analog signal sample.

4. The ADC of claim 1, wherein a bit position of the at least one low-order bit alternates over consecutive input analog signal samples or after every pre-determined number of analog signal samples.

5. The ADC of claim 1, further comprising:
    a selection circuitry configured to randomly select a bit position of the at least one low-order bit for each input analog signal sample based on an output of a pseudo-random generator.

6. The ADC of claim 1, wherein the trimming circuitry includes an up/down counter or a digital filter for averaging the low-order bits of the digital output bits of the plurality of input analog signal samples.

7. The ADC of claim 1, wherein the ADC include multiple comparators for either a multi-bit per cycle conversion or a single-bit per cycle conversion, and each comparator includes the trimming circuitry and the offset actuator for correction of the input DC offset of each comparator.

8. The ADC of claim 7, wherein an input DC offset of one comparator is corrected independently based on its own output, and an input DC offset of each of other comparators is corrected based on a combination of an output of each comparator and the output of the independently-corrected comparator.

9. The ADC of claim 1, wherein the DC offset actuator comprises a programmable capacitor, a programmable current source or a programmable resistor.

10. The ADC of claim 1, wherein the ADC is one of a successive approximation register ADC, a multi-step flash ADC, or a pipelined ADC.

11. A method for controlling a DC offset of a comparator of an analog-to-digital converter (ADC), comprising:
    sampling an input analog signal;
    converting each input analog signal sample to binary bits in multiple steps, wherein the ADC includes a comparator for comparing the input analog signal sample or a residual component of the input analog signal sample to a reference value in each step;
    receiving at least one low-order bit of binary bits of each input analog signal sample or an output of the comparator and averaging the at least one low-order bit or the output of the comparator over a plurality of input analog signal samples and generating a control signal for correcting an input DC offset of the comparator based on an average value of the low-order bits or the output of the comparator; and
    adjusting the input DC offset of the comparator based on the control signal.

12. The method of claim 11, wherein the control signal is generated based on a least significant bit (LSB) and/or a second-least significant bit of the digital output bits of the plurality of samples of the input analog signal.

13. The method of claim 11, wherein a bit position of the at least one low-order bit is fixed for each input analog signal sample.

14. The method of claim 11, wherein a bit position of the at least one low-order bit alternates over consecutive input analog signal samples or after every pre-determined number of analog signal samples.

15. The method of claim 11, wherein a bit position of the at least one low-order bit is randomly selected for each input analog signal sample based on an output of a pseudo-random generator.

16. The method of claim 11, wherein the ADC include multiple comparators for either a multi-bit per cycle conversion or a single-bit per cycle conversion, and the input DC offset of each comparator is corrected based on outputs of each comparator.

17. The method of claim 16, wherein an input DC offset of one comparator is corrected independently based on its own output, and an input DC offset of each of other comparators is corrected based on a combination of an output of each comparator and the output of the independently-corrected comparator.

18. The method of claim 11, wherein the input DC offset is adjusted using a DC offset actuator, wherein the DC offset actuator comprises a programmable capacitor, a programmable current source or a programmable resistor.

19. The method of claim 11, wherein the ADC is one of a successive approximation register ADC, a multi-step flash ADC, or a pipelined ADC.

20. A machine-readable storage including machine readable instructions, when executed, to implement a method of claim 11.

* * * * *